United States Patent
Jurrissen et al.

(10) Patent No.: US 10,203,394 B2
(45) Date of Patent: Feb. 12, 2019

(54) METAL RESISTANT MR IMAGING

(71) Applicant: PHILIPS GMBH, Hamburg (DE)

(72) Inventors: Michel Paul Jurriaan Jurrissen, Eindhoven (NL); Johan Michiel Den Harder, Eindhoven (NL); Ulrike Andrea Blume, Eindhoven (NL); Elwin De Weerdt, Eindhoven (NL); Gerrit Hendrik Van Ijperen, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 694 days.

(21) Appl. No.: 14/762,591

(22) PCT Filed: Jan. 6, 2014

(86) PCT No.: PCT/IB2014/058069
§ 371 (c)(1),
(2) Date: Jul. 22, 2015

(87) PCT Pub. No.: WO2014/115043
PCT Pub. Date: Jul. 31, 2014

(65) Prior Publication Data
US 2015/0362576 A1 Dec. 17, 2015

Related U.S. Application Data

(60) Provisional application No. 61/756,500, filed on Jan. 25, 2013.

(51) Int. Cl.
*G01R 33/565* (2006.01)
*G01R 33/44* (2006.01)
(Continued)

(52) U.S. Cl.
CPC ....... *G01R 33/5659* (2013.01); *G01R 33/288* (2013.01); *G01R 33/445* (2013.01);
(Continued)

(58) Field of Classification Search
USPC .................. 324/300–322; 600/407–435; 382/128–131
See application file for complete search history.

(56) References Cited

U.S. PATENT DOCUMENTS

| 6,995,559 B2 | 2/2006 | Agilandam et al. |
| 7,928,729 B2 * | 4/2011 | Hargreaves ........ G01R 33/4833 324/307 |

(Continued)

FOREIGN PATENT DOCUMENTS

| JP | 2001204725 A | 7/2001 |
| WO | 2012097094 A1 | 9/2010 |
| WO | 2012001583 A1 | 1/2012 |

OTHER PUBLICATIONS

Yang et al "Reduction of Magnetic Field Inhomogeneity Artifacts in Echo Planar Imaging With Sense and Gesepi at High Field" Magnetic Resonance in Medicine 52:1418-1423 (2004).
(Continued)

*Primary Examiner* — Tung X Nguyen
*Assistant Examiner* — Robert P Alejnikov, Jr.

(57) ABSTRACT

The invention relates to a method of MR imaging near metal parts using SEMAC. It is an object of the invention to provide an improved MR imaging technique that is sufficiently fast and robust against susceptibility effects. The invention proposes to apply a weaker slice-selection magnetic field gradient ($G_{slice}$) for reduction of ripple-artefacts near metal parts or to apply undersampling in the slice-selection direction of the SEMAC sequence or to apply both these aspects. According to one aspect of the invention, a sparsity constraint is used to make the reconstruction of the
(Continued)

undersampled MR images more stable. Moreover, the invention relates to a MR device (1) and to a computer program to be run on a MR device (1).

19 Claims, 3 Drawing Sheets

(51) Int. Cl.
    *G01R 33/28*     (2006.01)
    *G01R 33/561*     (2006.01)
(52) U.S. Cl.
    CPC ...... *G01R 33/5611* (2013.01); *G01R 33/5615* (2013.01); *G01R 33/56536* (2013.01); *G01R 33/56563* (2013.01)

(56) References Cited

U.S. PATENT DOCUMENTS

| | | | |
|---|---|---|---|
| 8,274,286 B2 * | 9/2012 | Koch | G01R 33/243 324/300 |
| 2004/0140802 A1 | 7/2004 | Weiguo | |
| 2004/0247081 A1 * | 12/2004 | Halsmer | A61B 6/00 378/108 |
| 2011/0241669 A1 | 10/2011 | Chen et al. | |
| 2013/0181711 A1 | 7/2013 | Chaari et al. | |
| 2014/0002080 A1 | 1/2014 | Den Harder et al. | |

OTHER PUBLICATIONS

Den Harder et al, "On the Relation of the Ripple Artifact in Multi-Spectral Imaging and Susceptibility Induced Field Gradients" Proc. Intl. Soc. Mag. Reson. Med 21, Apr. 20, 2013, p. 2562.
Li et al, "MSVAT-Space for Fast Metal Implants Imaging" Proc. Intl. Soc. Mag. Reson. Med. 19, Jan. 1, 2011 p. 3171.
Hargreaves et al, "Adaptive Slice Encoding for Metal Artifact Correction" Proc. Intl. Soc. Mag. Reson. Med. Jan. 1, 2010, p. 3083.
Koch et al, "Imaging Near Metal With a MAVRIC-SEMAC Hybrid" Magnetic Resonance in Medicine Academic Press vol. 65, No. 1, Jan. 1, 2010 p. 71-82.
Lu et al, "Compressive Slice Encoding for Metal Artifact Correction" Proc. Intl. Soc. Mag. Reson. Med. Jan. 1, 2010 p. 3079.
Lu et al, Slice Encoding for Metal Artifact Correction With Noise Reduction Magnetic Resonance in Medicine, vol. 65, No. 5 May 1, 2011 p. 1352-1357.
Lu et al, "POCS Based Compressive Slice Encoding for Metal Artifact Correction" Proc. Intl. Soc. Mag. Reson. Med 19, Jan. 1, 2011 p. 3174.
Koch et al, "Combined Parallel Imaging and Compressed Sensing on 3D Multi-Spectral Imaging Near Metal Implants" Proc. Intl. Soc. Mag. Reson. Med. 19, Jan. 1, 2011 p. 3172.
Choi et al, "Image Denoising Exploiting Sparsity and Low Rank Approximation . . . " Proc. Intl. Soc. Mag. Reson. Med 20 , Jan. 1, 2012 p. 221.
Lu et al , "SEMAC:Slice Encoding for Metal . . . " Magnetic Resonance in Medicine, vol. 62, No. 1, Jul. 1, 2009, p. 66-76.
Koch et al "A Multispectral Three-Dimensional Acqusition Technique for . . . " Magnetic Resonance in Medicine, Vol. 61, No. 1 Feb. 1, 2009, p. 381-390.
Hernando et al "Generalized Reconstruction of Multi-Spectral MR Acquisitions for Imaging Near Metal Implants" Proc. INTL. Soc. Mag. RESON. Med 17 (2009) p. 2860.
Koch et al "Z-Selective Multi-Slice 3D Imaging: a Mavric-Semac Hybrid" Proc. Intl. Soc. Mag. Reson. Med 18 (2010) p. 139.
Lu et al "Noise Reduction in Slice Encoding for Metal Artifact Correction Using Singular Value Decomposition" , Magnetic resonance in medicine (vol. 65, issue 5, pp. 1352-1357 ), May 2011.
Hargreaves et al "Fat-Suppressed and Distortion Corrected MRI Near Metallic Implants" ISMRM 2010 Conference Program 3084.
Koch et al "Mavrick Imaging Near Metal Implants With Improved Spatial Resolution and Reduced Acquisition Time" ISMRM 2010 Conference Program.
Den Harder et al MR Imaging Near Orthopedic Implants Using Slice-Encoded for Metal 4RTIFACT Correction and Off-Resonance Suppression ISMRM 2010 Confernce Program.
Cho et al "Total Inhomogeneity Correction Including Chemical Shifts and Susceptibility by View Angle Tilting" Med. Phys. 15(1) Jan/Feb 198 p. 7-11.

* cited by examiner

METAL RESISTANT MR IMAGING

CROSS-REFERENCE TO PRIOR APPLICATIONS

This application is the U.S. National Phase application under 35 U.S.C. § 371 of International Application No. PCT/IB2014/058069, filed on Jan. 06, 2014, which claims the benefit of U.S. patent application No. 61/756,500, filed on Jan. 25, 2013. These applications are hereby incorporated by reference herein.

FIELD OF THE INVENTION

The invention relates to the field of magnetic resonance (MR) imaging. It concerns methods of MR imaging of at least a portion of a body. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

SUMMARY OF THE INVENTION

According to the MR method in general, the body of the patient to be examined is arranged in a strong, uniform magnetic field ($B_0$ field) whose direction at the same time defines an axis (normally the z-axis) of the co-ordinate system in which the measurement is based. The magnetic field splits different energy levels for the individual nuclear spins in dependence on the magnetic field strength and the specific spin properties. The spin system can be excited (spin resonance) by application of an electromagnetic alternating field (RF field, also referred to as $B_1$ field) of defined frequency (so-called Larmor frequency, or MR frequency). From a macroscopic point of view the distribution of the individual nuclear spins produces an overall magnetization which can be deflected out of the state of equilibrium by application of an above mentioned electromagnetic pulse of appropriate radio frequency (RF pulse) while the corresponding $B_1$ magnetic field extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic RF pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of one or more receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, linear magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The MR signal data obtained via the RF coils corresponds to the spatial frequency domain and is called k-space data. The k-space data are usually acquired along multiple lines with different phase encoding values to achieve sufficient coverage. Each line is digitized during read-out by collecting a number of samples. A set of k-space data is converted to a MR image by means of Fourier transformation.

With aging population and an increasing number of patients carrying metal implants, the need for MR imaging of soft tissue in the presence of metal increases. Metal resistant MR imaging is required to enable imaging this soft tissue for diagnosis of complications and follow-up after surgery. MR imaging near metal is typically compromised by susceptibility issues degrading the magnetic fields used for image formation locally. In diagnostic MR imaging scans, the susceptibility of the metal parts causes MR signal pile-up, signal voids and other geometric distortions. Multispectral imaging techniques like SEMAC (Lu et al, ISMRM 2008, p. 838, or Magnetic Resonance in Medicine 2009, vol. 62, p. 66-76), MAVRIC (Koch et al, ISMRM 2008, p. 1250, or Magnetic Resonance in Medicine 2009, vol. 61, p. 381-390) and a MAVRIC-SEMAC hybrid (Koch et al, ISMRM 2010, p. 139, or Magnetic Resonance in Medicine 2011, vol. 65, p. 71-82) have been proposed to counter susceptibility issues in diagnostic MR imaging scans at the cost of increased scan duration, which scales with the required frequency coverage.

The SEMAC technique is based on a multi-slice TSE (Turbo Spin Echo) acquisition and applies an additional phase-encoding in the slice-selection direction (i.e. through-plane) to correct slice distortions. Many investigations show that SEMAC is capable of significantly reducing metal-induced artefacts. For the acquisition of spin echo signals from each (distorted) slice, a three-dimensional volume is encoded to enable reconstruction of the correct position of MR signal contributions. A (three-dimensional) slice image is reconstructed for each slice, wherein image values of the final MR image are computed by combining image values from the slice images of different slices.

SEMAC is an effective acquisition technique to reduce susceptibility artefacts due to presence of metal. However, close to metal parts, a residual artefact often remains visible, which will be referred to as ripple-artefact in the following. The same artefact is seen in the MAVRIC-SEMAC hybrid. It can be shown that the ripple-artefact is caused by a suboptimal transition between adjacent image slices or adjacent selected slabs. At these transitions, spin echo signal intensity has a substantially smaller amplitude than in the centre of each slice or slab. With image values from many slice or slab images contributing to the final MR image, especially in areas with strong $B_0$ variations, close to a metal part, these amplitude variations become visible as the ripple-artefact.

From the foregoing it is readily appreciated that there is a need for an improved MR imaging technique that is robust against susceptibility effects.

In accordance with one aspect of the invention, a method of MR imaging of at least a portion of a body placed within the examination volume of a MR device is disclosed. The method comprising the steps of:
- subjecting the portion of the body to an imaging sequence of RF pulses and switched magnetic field gradients, which imaging sequence includes:
  i) at least one slice- or slab-selective excitation RF pulse radiated toward the portion of the body in the presence of a magnetic field gradient in a slice- or slab-selection direction (z) for exciting magnetic resonance within a slice or slab,
  ii) one or more refocusing RF pulses radiated toward the portion of the body temporally subsequent to the excitation RF pulse for generating spin echo signals, and
  iii) a switched phase-encoding magnetic field gradient in the slice-selection direction (z) for phase-encoding of the spin echo signals,
- acquiring phase-encoded spin echo signals from a plurality of spatially adjacent slices or slabs, wherein the thickness of the slices or slabs is selected such that spatially adjacent slices or slabs overlap at least partially in the slice- or slab-selection direction (z), and
- reconstructing a MR image from the acquired phase-encoded spin echo signals, wherein a slice or slab image is reconstructed for each slice or slab, and wherein image values of the MR image are computed by combining image values from slice or slab images of different slices or slabs.

In accordance with the invention, the ripple-artefact is suppressed by selecting the thickness of the slices or slabs such that spatially adjacent slices overlap at least partially in the slice-selection direction. Spatially adjacent slices may overlap in the slice-selection direction by at least 10%, preferably by at least 30%, most preferably by at least 50%. In other words, the SEMAC acquisition scheme is adapted with regard to the slice-selection profile. To suppress the ripple-artefact, the slice-selection profile should be such that the combination of image values from different slices is as smooth as possible. In practice, this means that the spatial slice-selection profile should be approximately twice as wide in the slice-selection direction as usual. This may be achieved by decreasing the strength of the slice-selection magnetic field gradient which is present when radiating the excitation RF pulses, while maintaining a wide RF bandwidth of the slice- or slab-selective excitation RF pulse. The RF frequency offset of the excitation RF pulse is chosen such that the desired slice or slab distance is maintained The stronger slice distortion resulting from decreasing the slice-selection magnetic field gradient strength requires more through-plane phase-encoding steps to cover the required through-plane extent of the three-dimensional volume used for acquisition of each slice. The reduction of the ripple-artefact enables MR imaging and evaluating soft tissue close to a metal implant, for example for determining the extent to which an implant revision is required, or for diagnosing surgery complications or complications caused by the metal implant itself. Using the invention, diagnostic imaging of soft tissue can be performed closer to the metal implant than is possible with currently available scanning techniques or with conventional SEMAC, thereby enabling a more reliable evaluation of the soft tissue around the implant.

The application of overlapping slab selections of the gradient selected volumes in a MAVRIC-SEMAC hybrid acquisition also falls within the scope of the invention.

Although, as mentioned above, conventional SEMAC and especially SEMAC with overlapping slices according to the invention is capable of significant metal artefact reduction, the three-dimensional encoding of every single slice results in an extremely long scan time, which is one of the major drawbacks of SEMAC.

Known parallel acquisition techniques can be used for accelerating the multispectral MR signal acquisition. A method in this category is SENSE (Sensitivity Encoding). SENSE and other parallel acquisition techniques (like, for example, SMASH or GRAPPA) use undersampled k-space data acquisition obtained from multiple RF receiving coils in parallel. In these methods, the (complex) signal data from the multiple RF receive coils are combined with complex weightings in such a way as to suppress undersampling artifacts (aliasing) in the finally reconstructed MR images. This type of complex RF coil array signal combination is sometimes referred to as spatial filtering and includes combining in the k-space domain or in the image domain (in SENSE), as well as methods which are hybrids. In SENSE imaging, coil sensitivity profiles are typically estimated from low-resolution reference data. This coil sensitivity information is then used to "unwrap" aliased pixels in image space using a direct inversion algorithm.

SEMAC makes use of at least two phase-encoding directions (in-plane and through-plane) and is thus a candidate for parallel imaging in two spatial directions. Hence, in accordance with a preferred embodiment of the invention, the spin echo signals are acquired from each slice with undersampling in the slice-selection direction. The invention proposes, in other words, to apply SEMAC for metal-resistant imaging with undersampling of the phase-encoding in the through-plane direction. Undersampling means that fewer phase-encoding steps are performed than would be required according to the Nyquist criterion with respect to the geometrical size of the three-dimensional volume used for the acquisition of each slice in SEMAC. The reduced number of phase-encoding steps results in a significant reduction of the scan time. Aliasing artefacts caused by the undersampling may be removed by using a parallel image reconstruction algorithm like SENSE, SMASH, or GRAPPA, or by using the also per se known Compressed Sensing approach. The spin echo signals may be acquired by parallel signal acquisition via at least two RF coils having different spatial sensitivity profiles within the examination volume, wherein knowledge of the spatial sensitivity profiles is used for unfolding aliasing artefacts.

However, the three-dimensional volume used for acquisition of each slice in SEMAC is typically small in the through-plane direction. It is just large enough to cover the maximum expected distortion of the spatial slice-selection profile. This small three-dimensional volume renders parallel image reconstruction techniques instable in the through-plane direction, mainly caused by the small RF receiving coil sensitivity differences in the through-plane direction. The unfolding of aliasing artefacts resulting from MR signal contributions from different positions located close to each other in slice-selection direction results in parallel imaging artefacts and noise breakthrough.

These problems may be overcome in accordance with the invention by using overlapping slices (or slabs) with a spatial slice-selection profile that is significantly wider in the slice-selection direction as usual. Additionally or alternatively, a sparsity constraint may be used in the reconstruction of the MR image in SEMAC according to another aspect of the invention. The instability of parallel image reconstruction is resolved according to this aspect of the invention by adding prior knowledge to the inverse problem. The three-dimensional volume scanned for each slice contains only one (distorted) slice. Hence, for each in-plane location the received spin echo signals may originate from a limited number of positions in the slice-selection direction. This prior knowledge can, for example, be used as a sparsity constraint that renders the reconstruction of the slice images considerably more stable.

One important aspect of the invention is thus to use one or more sparsity constraints to enable stable reconstruction from the three-dimensional spin echo data acquired in SEMAC with undersampling in the slice-selection direction. In a preferred embodiment of the invention, two different sparsity constraints may be used:

For each in-plane location of a three-dimensional volume, only a limited number of through-plane coordinates contain signal contributions. These coordinates correspond to the distorted slice selection in the through-plane direction. This region with selected signal is considerably smaller than the total size of the three-dimensional volume used for acquisition of each slice in the slice encoding direction.

The positions of the coordinates of the distorted slice selection in the through-plane direction changes relatively smoothly as function of the in-plane coordinates.

These sparsity constraints may advantageously be used in practice, for example, as regularisation terms in the numerical solution of the inverse problem of parallel image reconstruction.

In a preferred embodiment of the invention, the reconstruction of the MR image is iterative, wherein the sparsity constraint is derived in an earlier iteration of the reconstruction of the MR image and applied in a later iteration of the reconstruction of the MR image. This approach is particularly well suited for MR image reconstruction according to the invention using an iterative SENSE algorithm.

In a further preferred embodiment of the invention, a prediction of the spatial origin of spin echo signal contributions within the three-dimensional slice volumes may be used. To this end, the sparsity constraints may be derived from a spatial excitation profile of the excitation RF pulse. The spatial excitation profile may, for example, be derived as a slice deformation map from a $B_0$ map that indicates the spatial distribution of the main magnetic field $B_0$ in the vicinity of a metal part within the examined body portion. With this slice deformation map, regions within the three-dimensional volume used for each slice in SEMAC from which no signal contributions are expected can be set to zero or can be regularised, resulting in a stable reconstruction of the slice images.

The application of a sparsity constraint to improve parallel imaging in the through-plane direction in a MAVRIC-SEMAC hybrid acquisition also falls within the scope of the invention.

The method of the invention described thus far can be carried out by means of a MR device including at least one main magnet coil for generating a uniform steady magnetic field within an examination volume, a number of gradient coils for generating switched magnetic field gradients in different spatial directions within the examination volume, at least one RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention is preferably implemented by a corresponding programming of the reconstruction unit and/or the control unit of the MR device.

The methods of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control and/or reconstruction unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
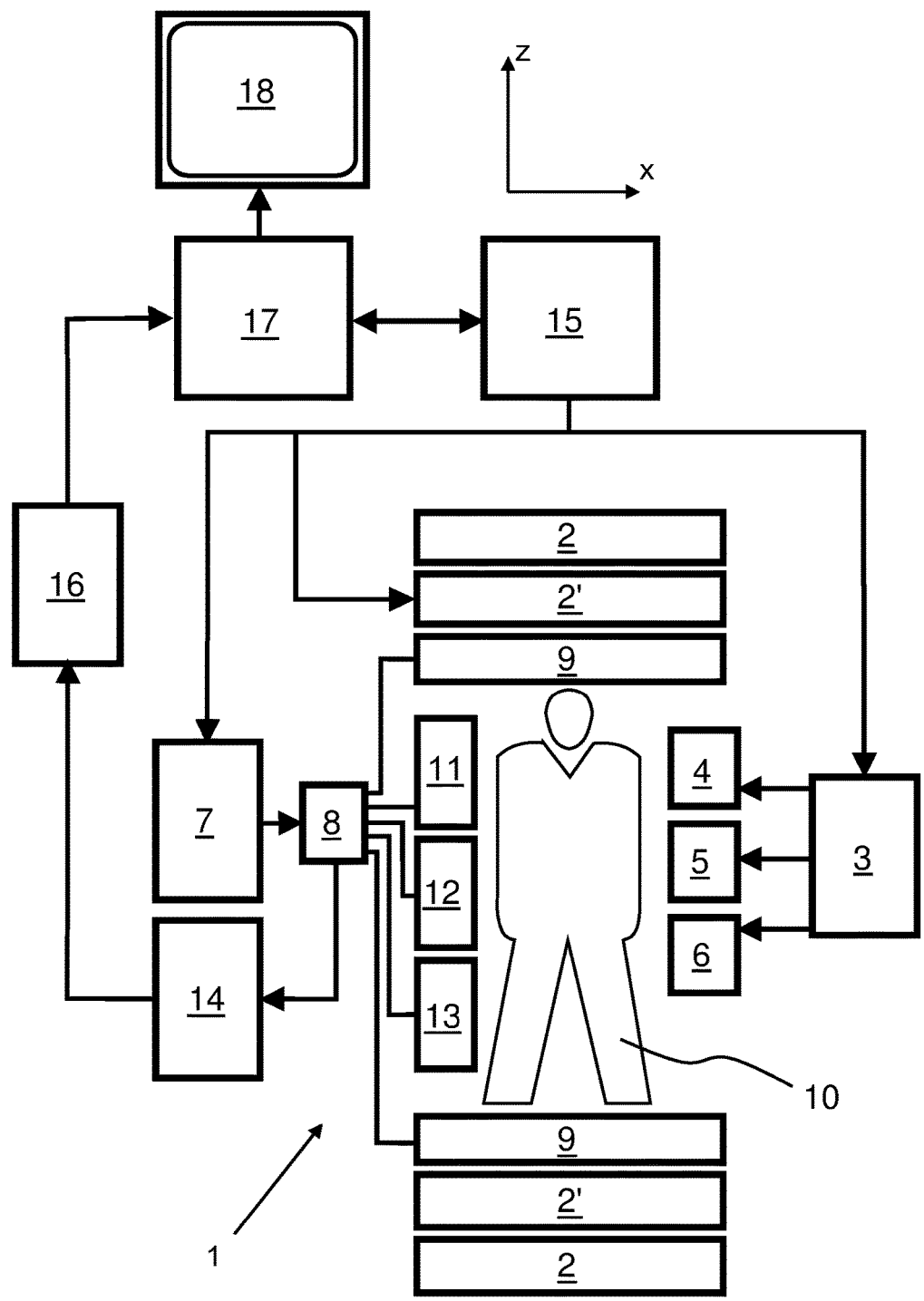
FIG. 1 schematically shows a MR device for carrying out the method of the invention.

With reference to FIG. 1, a MR device 1 is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a -body RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume.

For generation of MR images of regions of the body 10 by means of parallel imaging, a set of local array RF coils 11, 12, 13 are placed contiguous to the region selected for imaging. The array RF coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the current flow through the shimming coils 2' as well as the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies appropriate reconstruction algorithms, such like SENSE. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

Figure 2:
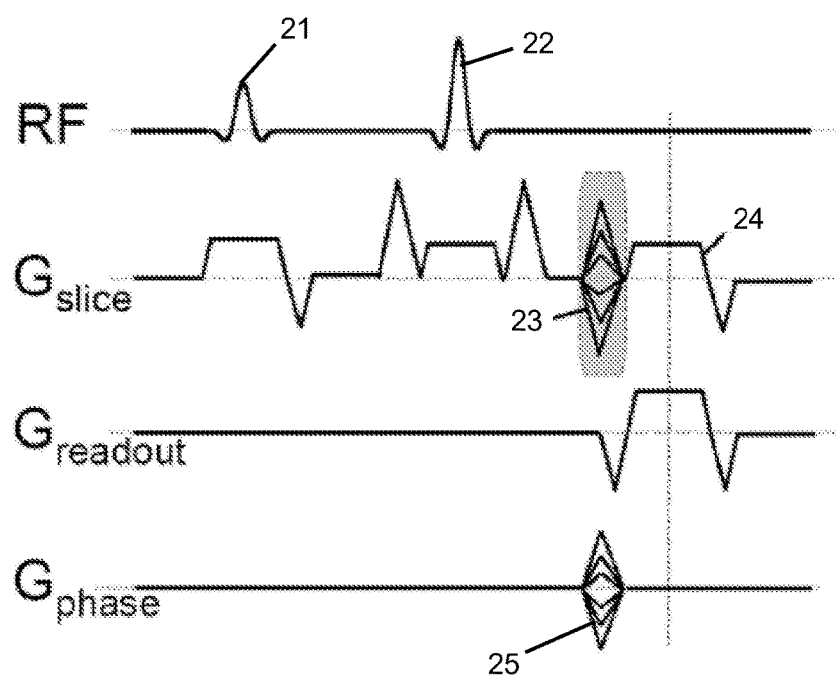
FIG. 2 shows a diagram illustrating the SEMAC imaging sequence used according to the invention.

FIG. 2 shows a schematic diagram illustrating an imaging sequence according to the invention. The depicted imaging sequence is a SEMAC sequence. The sequence starts with a slice-selective excitation RF pulse 21 radiated toward the portion of the body 10 in the presence of a magnetic field gradient $G_{slice}$ in a slice-selection direction z. The figure further shows the first of a plurality of refocusing RF pulses 22 radiated toward the portion of the body 10 temporally subsequent to the excitation RF pulse 21. The RF pulses 22 refocus the nuclear magnetization such that spin echo signals (not shown) are generated. Switched phase-encoding magnetic field gradients 23 are applied in the slice-selection direction for phase-encoding of the spin echo signals. The spin echo signals are acquired in the presence of a readout magnetic field gradient $G_{readout}$ for frequency-encoding of the spin echo signals in a frequency-encoding direction x and in the presence of a view-angle-tilting (VAT) magnetic field gradient 24. The VAT magnetic field gradient 24 is used for compensating in-plane distortions induced in the vicinity of metal parts. Further, phase-encoding magnetic field gradients $G_{phase}$ 25 are applied for phase-encoding the spin echo signals also in a preparation direction y. The spin echo signals that are phase-encoded in the y- and z-directions are acquired from different slices according to the known SEMAC technique. According to the invention, the spin echo signals are acquired from each slice with undersampling in the slice-selection direction z and—where applicable—also with undersampling in the preparation direction y (2D SENSE). Finally, a MR image is reconstructed from the acquired phase-encoded spin echo signals, wherein a slice image is reconstructed for each slice, for example by means of the known SENSE algorithm. Image values of the final MR image are computed by combining image values from the slice images of the different slices according to the SEMAC scheme so as to compensate for through-plane distortions of the excited slices.

While SEMAC is an effective acquisition technique to reduce susceptibility artefacts due to presence of metal, a residual artefact often remains visible close to metal parts. This ripple-artefact is caused by a suboptimal transition between adjacent image slices. The ripple-artefact can be suppressed in accordance with the invention by selecting the thickness of the slices such that spatially adjacent slices overlap at least partially in the slice-selection direction. To effectively suppress the ripple-artefact, the slice-selection profile should be such that the combination of image values from different slices is as smooth as possible. In practice, this means that the spatial slice-selection profile should be approximately twice as wide in the slice-selection direction as usual. This may be achieved by decreasing the strength of the slice-selection magnetic field gradient which is present when radiating the excitation RF pulses. When imaging near metal, the slice selection profile varies per position. Close to the metal, the imaged slice thickness is typically smaller than far from the metal, due to (i) slice selection variations and (ii) limitations of the frequency encoding process. This means that especially near metal parts (i.e. where the ripple artefact becomes visible) the gap between adjacent slices is larger than elsewhere, so an even weaker slice-selection gradient is required to close this gap, which may result in a double slice-selection width in practice. Far from the metal parts, this weaker slice-selection gradient results in an overlap of the selected slices by up to 50% of the slice thickness.

Figure 3:
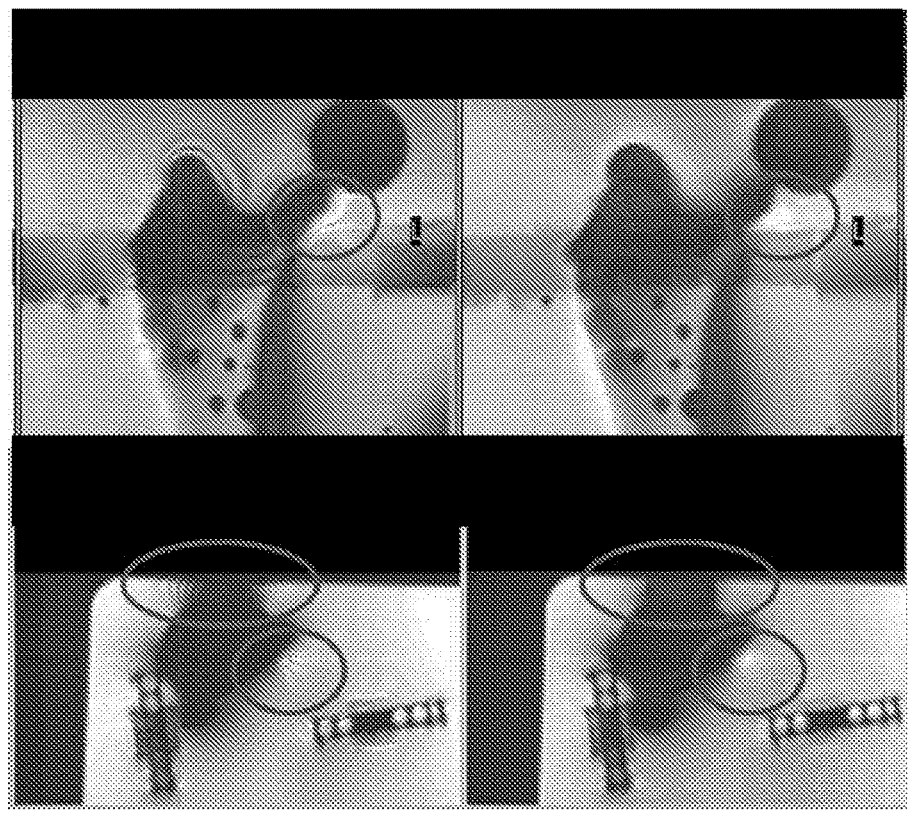
FIG. 3 shows example MR images of a titanium hip implant scanned with conventional SEMAC (left column) and with weaker selection gradients, resulting in a reduction of ripple-artefacts (right column)

FIG. 3 shows an example of a titanium hip implant scanned with conventional SEMAC (left column) and with weaker slice-selection magnetic field gradients. The reduction of the magnetic field gradient strength results in a reduction of the ripple-artefacts (right column). The regions containing pronounced ripple-artefacts are highlighted in FIG. 3. As can be seen in FIG. 3, the invention enables diagnostic MR imaging of soft tissue closer to metal implants than is possible with conventional SEMAC. This allows a more reliable evaluation of the soft tissue around the implant.

Figure 4:
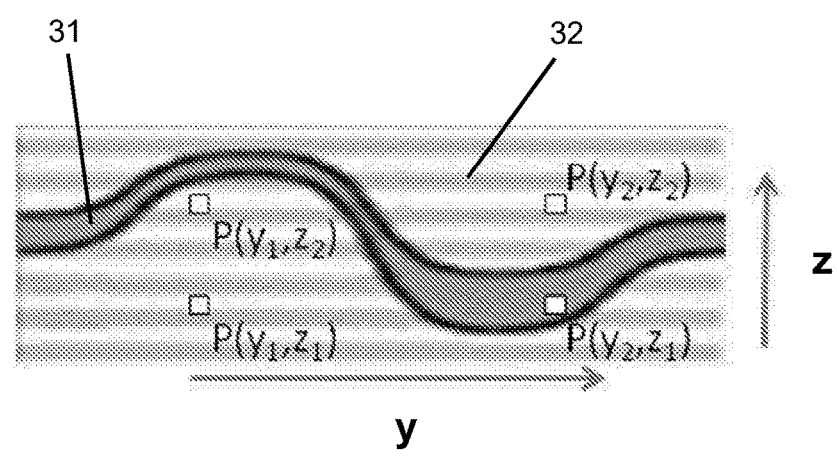
FIG. 4 illustrates aliasing patterns occurring in three-dimensional slice images with undersampling in the in-plane and through-plane directions.

FIG. 4 shows an aliasing pattern in case of undersampling in the y- and z-directions with an undersampling factor of 2 in the preparation direction y and an undersampling factor 2 in the through-plane direction z. This results in a total acceleration factor of 4. As can be seen in the figure, four image pixels are folded onto one location. Due to the small folding distance in the z-direction, this is not well-suited for unfolding via SENSE reconstruction, since the RF coil sensitivities vary little over the small distance. The figure further depicts the profile of the excited slice 31 which is distorted due to the presence of metal parts. Spin echo signals origin exclusively from the slice region 31. For the acquisition of the spin echo signals from the distorted slice 31, the three-dimensional volume 32 is encoded in the x-, y- and z-directions in accordance with the SEMAC scheme to enable reconstruction of the correct positions of spin echo signal contributions. As shown in the figure, there is no signal contribution from a large part of the volume 32. As an extreme example, from the four highlighted pixels only one pixel contains a signal contribution. This is added as prior knowledge to the inverse problem of reconstruction of the slice image from the three-dimensional volume 32 scanned for slice 31. This prior knowledge is used as a sparsity constraint that renders the reconstruction of the slice image more stable.

In the following a detailed description of multiple possible implementations of the approach of the invention is given.

Using a Deformation Map

With a deformation map, which may be derived from $B_0$ mapping scan or a coarse resolution SEMAC scan, a prediction can be made on the shape of the distorted slice 31. This prediction can be rough. However, the error of this prediction should be smaller than the SENSE folding distance in the slice-encoding direction z.

As an extreme example, in areas where no signal contribution is expected according to the deformation map, the pixel values may be set to zero. By setting the pixel values to zero in a large part of the three-dimensional volume 32, the solution of the SENSE inversion problem becomes much more stable. The deformation map is used to determine for each pair of x- and y-coordinates the z-coordinate interval from which spin echo signal contribution can be expected.

For the four pixels highlighted in FIG. 4, the deformation map can be used to set the reconstructed pixels $P(y_1,z_1)$ and $P(y_2,z_2)$ to zero. So the SENSE reconstruction becomes stable. This is because (i) only two pixels have to be unfolded and (ii) the distance between these pixels is large (so the RF coil sensitivities are different, which leads to a stable matrix inversion).

Instead of setting the signal to zero in a large part of the volume, this can be done more smoothly by applying a variable SENSE regularisation. The regularisation changes smoothly from a normal regularisation in the areas where signal contribution is expected to very strong regularisation in areas where no signal contribution is expected. So let R be the normal SENSE regularisation matrix, then this can be multiplied with the expected signal from a deformation map ($E_{\Delta B0}$) to calculate the new regularisation matrix $R_{\Delta B0}$ ($=E_{\Delta B0}*R$). With S as sensitivity matrix and $\Psi$ the noise de-correlation matrix, the SENSE combination factors H are calculated by:

$$H=(S^H\Psi^{-1}S+R_{\Delta B_0}^{-1})^{-1}S^H\Psi^{-1}$$

It should be noted that by using a deformation map it is not necessarily required to use the different spatial coil sensitivity profiles to determine the shape of the distorted slice. It is thus even possible to apply undersampling in the slice-encoding direction with signal acquisition via only one RF receiving coil, for example the body coil 9.

Auto-Calibration

An alternative for using a separate scan to determine the deformation map is to acquire an extra set of slices (a subset of all slices) within the SEMAC scan, for example one extra stack of slices, but without through-plane undersampling and on a coarse grid. By using a coarse grid the scan time for acquisition of the auto-calibration data can be reduced drastically. The reconstruction of the auto-calibration slices (without aliasing) is used to determine roughly the shape of the excited slices. The acquisition of the auto-calibration data slightly increases the overall scan time, but avoids the need of a separate $B_0$ mapping scan.

Iterative Reconstruction

With a normal two-dimensional SENSE reconstruction, i.e. without using any sparsity constraints, the reconstruction of the slice images is less stable. But the resulting slice image containing artefacts can be used as a first estimate for determining the shape of the distorted slice. So after a first SENSE reconstruction using a normal regularisation R, the SENSE reconstruction can be repeated, but now using the output of the first reconstruction and regularise stronger with $R_{iter}$ in this next iteration:

$$H=(S^H\Psi^{-1}S+R_{iter}^{-1})^{-1}S^H\Psi^{-1}$$

This can be done with one or more iterations. The slice image of the previous iteration should be smoothed and/or filtered to reduce noise.

Least Error Reconstruction

As mentioned before, for each set of folded pixels in a two-dimensional SENSE reconstruction only some of the pixels may contribute to the acquired spin echo signals. A possible implementation is to solve the SENSE equations while arbitrarily regularizing different pixel values to a low value or setting them to zero. In this fashion multiple SENSE solutions are calculated (each with a different selection of pixel values that are regularized to a low value or set to zero). Finally, the SENSE solution best describing the acquired signal data is selected as slice image. The regularization of pixel values to a low value or setting of pixel values to zero can be done with usage of the knowledge that for every in-plane position x, y only a limited number of coordinates in the through-plane direction contains a signal contribution and the shape of the distorted slice varies relatively smoothly as function of the in-plane coordinates x, y.

For the four pixels highlighted in FIG. 4, the following pixels are regularized to a low value or set to zero in the different SENSE reconstructions: $\{P(y_1,z_1)=P(y_2,z_1)=0\}$, $\{P(y_1,z_1)=P(y_2,z_2)=0\}$, $\{P(y_1,z_2)=P(y_2,z_1)=0\}$, $\{P(y_1,z_2)=P(y_2,z_2)=0\}$. From these four SENSE reconstructions, the solution that sets $P(y_2,z_1)$ to a significant value will yield the smallest error and will thus be selected as the correct slice image.

The invention claimed is:

1. A method of magnetic resonance imaging of at least a portion of a body placed within the examination volume of a magnetic resonance device, the method comprising the steps of:
   subjecting the portion of the body to an imaging sequence of radio frequency pulses and a plurality of switched magnetic field gradients generated by a plurality of gradient coils of the magnetic resonance device, the imaging sequence comprising:
   at least one slice-selective or slab-selective excitation radio frequency pulse, generated by at least one radio frequency coil of the magnetic resonance device, radiated toward the portion of the body in the presence of a magnetic field gradient in a slice-selection or slab-selection direction for exciting magnetic resonance within a slice or slab,
   one or more refocusing radio frequency pulses, generated by the at least one radio frequency coil, radiated toward the portion of the body temporally subsequent to the excitation radio frequency pulse for generating spin echo signals, and
   a switched phase-encoding magnetic field gradient in the slice-selection direction for phase-encoding of the spin echo signals,
   acquiring phase-encoded spin echo signals from a plurality of spatially adjacent slices or slabs, by at least one radio frequency coil configured to receive magnetic resonance signals, wherein the thickness of the slices or slabs is selected such that spatially adjacent slices or slabs overlap at least partially in the slice-selection or slab-selection direction, and reconstructing, by a reconstruction unit of the magnetic resonance device, a magnetic resonance image from the acquired phase-encoded spin echo signals using a sparsity constraint,
wherein a slice or slab image is reconstructed for each slice or slab, and
wherein image values of the magnetic resonance image are computed by combining image values from slice or slab images of different slices or slabs.

2. The method of claim 1, wherein the sparsity constraint is derived from a spatial excitation profile of the excitation radio frequency pulse.

3. The method of claim 1, wherein the spatial excitation profile is derived from a $B_0$ map indicating the spatial distribution of the main magnetic field $B_0$.

4. The method of claim 1, wherein the reconstruction of the magnetic resonance image is iterative, wherein the sparsity constraint is derived in an earlier iteration of the reconstruction of the magnetic resonance image and applied in a later iteration of the reconstruction of the magnetic resonance image.

5. The method of claim 1, wherein the phase-encoded spin echo signals are acquired from each slice or slab with undersampling in the slice-selection or slab-selection direction.

6. The method of claim 1, wherein spatially adjacent slices or slabs overlap in the slice-selection or slab-selection direction by at least 10.

7. The method of claim 1, wherein the phase-encoded spin echo signals are acquired in the presence of a view-angle-tilting magnetic field gradient in the slice-selection or slab-selection direction.

8. The method of claim 1, wherein the spin echo signals are acquired by parallel signal acquisition via at least two radio frequency coils having different spatial sensitivity profiles within the examination volume.

9. The method of claim 1, wherein the reconstruction of the slice images is performed by at least one of parallel image reconstruction algorithm selected from a group consisting of: SENSE, SMASH, GRAPPA, and Compressed Sensing.

10. The method of claim 1, wherein spatially adjacent slices or slabs overlap in the slice-selection or slab-selection direction by at least 30%.

11. The method of claim 1, wherein spatially adjacent slices or slabs overlap in the slice-selection or slab-selection direction by at least 50%.

12. The method of claim 1, wherein spatially adjacent slices or slabs overlap in the slice-selection or slab-selection direction by at least 10%.

13. The method of claim 1, wherein the phase-encoded spin echo signals are acquired in the presence of a view-angle-tilting magnetic field gradient in the slice-selection or slab-selection direction.

14. The method of claim 1, wherein the spin echo signals are acquired by parallel signal acquisition via at least two radio frequency coils having different spatial sensitivity profiles within the examination volume.

15. The method of claim 1, wherein the reconstruction of the slice images is performed by at least one parallel image reconstruction algorithm selected from a group consisting of: SENSE, SMASH, GRAPPA, and Compressed Sensing.

16. A method of magnetic resonance imaging of at least a portion of a body placed within the examination volume of a magnetic resonance device, the method comprising the steps of:
subjecting the portion of the body to an imaging sequence of radio frequency pulses and a plurality of switched magnetic field gradients generated by a plurality of gradient coils of the magnetic resonance device, the imaging sequence comprising:
at least one slice-selective or slab-selective excitation radio frequency pulse, generated by at least one radio frequency coil of the magnetic resonance device, radiated toward the portion of the body in the presence of a magnetic field gradient in a slice-selection or slab-selection direction for exciting magnetic resonance within a slice or slab,
one or more refocusing radio frequency pulses, generated by the at least one radio frequency coil, radiated toward the portion of the body temporally subsequent to the excitation radio frequency pulse for generating spin echo signals, and
a switched phase-encoding magnetic field gradient in the slice-selection direction (z) for phase-encoding of the spin echo signals,
acquiring phase-encoded spin echo signals from a plurality of spatially adjacent slices or slabs by at least one radio frequency coil configured to receive magnetic resonance signals, and
reconstructing, by a reconstruction unit of the magnetic resonance device, a magnetic resonance image from the acquired phase-encoded spin echo signals using a sparsity constraint, wherein a slice or slab image is reconstructed for each slice or slab, and wherein image values of the magnetic resonance image are computed by combining image values from slice or slab images of different slices or slabs.

17. A magnetic resonance device comprising at least one main magnet coil for generating a uniform, steady magnetic field within an examination volume, a plurality of gradient coils for generating a plurality of switched magnetic field gradients in different spatial directions within the examination volume, at least one radio frequency coil for generating a plurality radio frequency pulses within the examination volume, at least one radio frequency coil for receiving magnetic resonance signals from at least a portion of a body of a patient positioned in the examination volume, a control unit for controlling the temporal succession of a plurality of radio frequency pulses and a plurality of switched magnetic field gradients, and a reconstruction unit for reconstructing magnetic resonance images from the received magnetic resonance signals, wherein the magnetic resonance device is configured to perform a method of magnetic resonance imaging, the method comprising:
subjecting the portion of the body to an imaging sequence of radio frequency pulses and a plurality of switched magnetic field gradients generated by the plurality of gradient coils, the imaging sequence comprising:
at least one slice-selective or slab-selective excitation radio frequency pulse, generated by at least one radio frequency coil of the magnetic resonance device, radiated toward the portion of the body in the presence of a magnetic field gradient in a slice-selection or slab-selection direction for exciting magnetic resonance within a slice or slab,
one or more refocusing radio frequency pulses, generated by the at least one radio frequency coil, radiated toward the portion of the body temporally subsequent to the excitation radio frequency pulse for generating spin echo signals, and a switched phase-encoding magnetic field gradient in the slice-selection direction for phase-encoding of the spin echo signals, acquiring phase-encoded spin echo signals from a plurality of spatially adjacent slices or slabs, by at least one radio frequency coil configured to receive magnetic resonance signals, wherein the thickness of the slices or slabs is selected such that spatially adjacent slices or slabs overlap at least partially in the slice-selection or slab-selection direction, and reconstructing, by a reconstruction unit of the magnetic resonance device, a magnetic resonance image from the acquired phase-encoded spin echo signals using a sparsity constraint, wherein a slice or slab image is reconstructed for each slice or slab, wherein image values of the magnetic resonance image are computed by combining image values from slice or slab images of different slices or slabs.

18. The magnetic resonance device of claim 17, wherein the reconstruction of the slice images is performed by a parallel image reconstruction algorithm like SENSE, SMASH, or GRAPPA, or by Compressed Sensing.

19. A computer program to be run on a magnetic resonance device, which computer program comprises instructions for carrying out a method of magnetic resonance imaging, the method comprising:

subjecting the portion of a body to an imaging sequence of radio frequency pulses and a plurality of switched magnetic field gradients generated by the plurality of gradient coils, the imaging sequence comprising:

at least one slice-selective or slab-selective excitation radio frequency pulse, generated by at least one radio frequency coil of the magnetic resonance device, radiated toward the portion of the body in the presence of a magnetic field gradient in a slice-selection or slab-selection direction for exciting magnetic resonance within a slice or slab, one or more refocusing radio frequency pulses, generated by the at least one radio frequency coil, radiated toward the portion of the body temporally subsequent to the excitation radio frequency pulse for generating spin echo signals, and a switched phase-encoding magnetic field gradient in the slice-selection direction for phase-encoding of the spin echo signals, acquiring phase-encoded spin echo signals from a plurality of spatially adjacent slices or slabs, by at least one radio frequency coil configured to receive magnetic resonance signals, wherein the thickness of the slices or slabs is selected such that spatially adjacent slices or slabs overlap at least partially in the slice-selection or slab-selection direction, and reconstructing, by a reconstruction unit of the magnetic resonance device, a magnetic resonance image from the acquired phase-encoded spin echo signals using a sparsity constraint, wherein a slice or slab image is reconstructed for each slice or slab, wherein image values of the magnetic resonance image are computed by combining image values from slice or slab images of different slices or slabs.

* * * * *